(12) United States Patent
Yao et al.

(10) Patent No.: US 9,040,393 B2
(45) Date of Patent: May 26, 2015

(54) METHOD OF FORMING SEMICONDUCTOR STRUCTURE

(75) Inventors: Liang-Gi Yao, Shin Chu (TW); Chia-Cheng Chen, Hsinchu (TW); Ta-Ming Kuan, Zhongli (TW); Jeff J. Xu, Jhubei (TW); Clement Hsingjen Wann, Carmel, NY (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 247 days.

(21) Appl. No.: 13/242,090

(22) Filed: Sep. 23, 2011

(65) Prior Publication Data

US 2012/0015503 A1 Jan. 19, 2012

Related U.S. Application Data

(63) Continuation-in-part of application No. 12/687,574, filed on Jan. 14, 2010, now Pat. No. 8,106,469.

(60) Provisional application No. 61/405,858, filed on Oct. 22, 2010.

(51) Int. Cl.
| | |
|---|---|
| *H01L 21/20* | (2006.01) |
| *H01L 21/265* | (2006.01) |
| *H01L 29/49* | (2006.01) |
| *H01L 29/51* | (2006.01) |
| *H01L 21/28* | (2006.01) |
| *H01L 29/66* | (2006.01) |
| *H01L 29/78* | (2006.01) |

(52) U.S. Cl.
CPC ..... *H01L 21/26506* (2013.01); *H01L 21/28088* (2013.01); *H01L 21/28194* (2013.01); *H01L 21/2822* (2013.01); *H01L 29/4966* (2013.01); *H01L 29/517* (2013.01); *H01L 29/6659* (2013.01); *H01L 29/7833* (2013.01)

(58) Field of Classification Search
USPC .............. 438/478, 591; 257/E21.09, E21.409
See application file for complete search history.

(56) References Cited

U.S. PATENT DOCUMENTS

| | | | |
|---|---|---|---|
| 5,581,202 A | 12/1996 | Yano et al. | |
| 5,767,732 A | 6/1998 | Lee et al. | |
| 5,963,789 A | 10/1999 | Tsuchiaki | |

(Continued)

FOREIGN PATENT DOCUMENTS

| | | |
|---|---|---|
| CN | 1945829 | 4/2004 |
| CN | 101179046 | 5/2005 |

(Continued)

OTHER PUBLICATIONS

Quirk et al., Semiconductor Manufacturing Technology, Oct. 2001, Prentice Hall, Chapter 16.

(Continued)

*Primary Examiner* — Trung Q Dang
(74) *Attorney, Agent, or Firm* — Lowe Hauptman & Ham, LLP

(57) ABSTRACT

A method of forming a semiconductor device includes chemically cleaning a surface of a substrate to form a chemical oxide material on the surface. At least a portion of the chemical oxide material is removed at a removing rate of about 2 nanometer/minute (nm/min) or less. Thereafter, a gate dielectric layer is formed over the surface of the substrate.

17 Claims, 14 Drawing Sheets

(56) References Cited

U.S. PATENT DOCUMENTS

| | | | |
|---|---|---|---|
| 6,121,786 | A | 9/2000 | Yamagami et al. |
| 6,503,794 | B1 | 1/2003 | Matsuda et al. |
| 6,613,634 | B2 | 9/2003 | Ootsuka et al. |
| 6,622,738 | B2 | 9/2003 | Scovell |
| 6,642,090 | B1 | 11/2003 | Fried et al. |
| 6,706,571 | B1 | 3/2004 | Yu et al. |
| 6,713,365 | B2 | 3/2004 | Lin et al. |
| 6,727,557 | B2 | 4/2004 | Takao |
| 6,743,673 | B2 | 6/2004 | Watanabe et al. |
| 6,762,448 | B1 | 7/2004 | Lin et al. |
| 6,791,155 | B1 | 9/2004 | Lo et al. |
| 6,828,646 | B2 | 12/2004 | Marty et al. |
| 6,830,994 | B2 | 12/2004 | Mitsuki et al. |
| 6,858,478 | B2 | 2/2005 | Chau et al. |
| 6,872,647 | B1 | 3/2005 | Yu et al. |
| 6,940,747 | B1 | 9/2005 | Sharma et al. |
| 6,949,768 | B1 | 9/2005 | Anderson et al. |
| 6,964,832 | B2 | 11/2005 | Moniwa et al. |
| 7,009,273 | B2 | 3/2006 | Inoh et al. |
| 7,018,901 | B1 | 3/2006 | Thean et al. |
| 7,026,232 | B1 | 4/2006 | Koontz et al. |
| 7,067,400 | B2 | 6/2006 | Bedell et al. |
| 7,078,312 | B1 | 7/2006 | Sutanto et al. |
| 7,084,079 | B2 | 8/2006 | Conti et al. |
| 7,084,506 | B2 | 8/2006 | Takao |
| 7,112,495 | B2 | 9/2006 | Ko et al. |
| 7,153,744 | B2 | 12/2006 | Chen et al. |
| 7,157,351 | B2 | 1/2007 | Cheng et al. |
| 7,190,050 | B2 | 3/2007 | King et al. |
| 7,193,399 | B2 | 3/2007 | Aikawa |
| 7,247,887 | B2 | 7/2007 | King et al. |
| 7,265,008 | B2 | 9/2007 | King et al. |
| 7,265,418 | B2 | 9/2007 | Yun et al. |
| 7,297,600 | B2 | 11/2007 | Oh et al. |
| 7,300,837 | B2 | 11/2007 | Chen et al. |
| 7,323,375 | B2 | 1/2008 | Yoon et al. |
| 7,351,622 | B2 | 4/2008 | Buh et al. |
| 7,358,166 | B2 | 4/2008 | Agnello et al. |
| 7,361,563 | B2 | 4/2008 | Shin et al. |
| 7,374,986 | B2 | 5/2008 | Kim et al. |
| 7,394,116 | B2 | 7/2008 | Kim et al. |
| 7,396,710 | B2 | 7/2008 | Okuno |
| 7,407,847 | B2 | 8/2008 | Doyle et al. |
| 7,410,844 | B2 | 8/2008 | Li et al. |
| 7,425,740 | B2 | 9/2008 | Liu et al. |
| 7,442,967 | B2 | 10/2008 | Ko et al. |
| 7,456,087 | B2 | 11/2008 | Cheng |
| 7,494,862 | B2 | 2/2009 | Doyle et al. |
| 7,508,031 | B2 | 3/2009 | Liu et al. |
| 7,528,465 | B2 | 5/2009 | King et al. |
| 7,534,689 | B2 | 5/2009 | Pal et al. |
| 7,538,387 | B2 | 5/2009 | Tsai |
| 7,550,332 | B2 | 6/2009 | Yang |
| 7,598,145 | B2 | 10/2009 | Damlencourt et al. |
| 7,605,449 | B2 | 10/2009 | Liu et al. |
| 7,682,911 | B2 | 3/2010 | Jang et al. |
| 7,759,228 | B2 | 7/2010 | Sugiyama et al. |
| 7,795,097 | B2 | 9/2010 | Pas |
| 7,798,332 | B1 | 9/2010 | Brunet |
| 7,820,513 | B2 | 10/2010 | Hareland et al. |
| 7,851,865 | B2 | 12/2010 | Anderson et al. |
| 7,868,317 | B2 | 1/2011 | Yu et al. |
| 7,898,041 | B2 | 3/2011 | Radosavljevic et al. |
| 7,923,321 | B2 | 4/2011 | Lai et al. |
| 7,923,339 | B2 | 4/2011 | Meunier-Beillard et al. |
| 7,960,791 | B2 | 6/2011 | Anderson et al. |
| 7,985,633 | B2 | 7/2011 | Cai et al. |
| 7,989,846 | B2 | 8/2011 | Furuta |
| 7,989,855 | B2 | 8/2011 | Narihiro |
| 8,003,466 | B2 | 8/2011 | Shi et al. |
| 8,043,920 | B2 | 10/2011 | Chan et al. |
| 8,076,189 | B2 | 12/2011 | Grant |
| 8,101,475 | B2 | 1/2012 | Oh et al. |
| 2003/0080361 | A1 | 5/2003 | Murthy et al. |
| 2003/0109086 | A1 | 6/2003 | Arao |
| 2003/0234422 | A1 | 12/2003 | Wang et al. |
| 2004/0075121 | A1 | 4/2004 | Yu et al. |
| 2004/0129998 | A1 | 7/2004 | Inoh et al. |
| 2004/0192067 | A1 | 9/2004 | Ghyselen et al. |
| 2004/0219722 | A1 | 11/2004 | Pham et al. |
| 2004/0259315 | A1 | 12/2004 | Sakaguchi et al. |
| 2005/0020020 | A1 | 1/2005 | Collaert et al. |
| 2005/0051865 | A1 | 3/2005 | Lee et al. |
| 2005/0082616 | A1 | 4/2005 | Chen et al. |
| 2005/0153490 | A1 | 7/2005 | Yoon et al. |
| 2005/0170593 | A1 | 8/2005 | Kang et al. |
| 2005/0212080 | A1 | 9/2005 | Wu et al. |
| 2005/0221591 | A1 | 10/2005 | Bedell et al. |
| 2005/0224800 | A1 | 10/2005 | Lindert et al. |
| 2005/0233598 | A1 | 10/2005 | Jung et al. |
| 2005/0266698 | A1 | 12/2005 | Cooney et al. |
| 2005/0280102 | A1 | 12/2005 | Oh et al. |
| 2006/0038230 | A1 | 2/2006 | Ueno et al. |
| 2006/0068553 | A1 | 3/2006 | Thean et al. |
| 2006/0091481 | A1 | 5/2006 | Li et al. |
| 2006/0091482 | A1 | 5/2006 | Kim et al. |
| 2006/0091937 | A1 | 5/2006 | Do |
| 2006/0105557 | A1 | 5/2006 | Klee et al. |
| 2006/0128071 | A1 | 6/2006 | Rankin et al. |
| 2006/0138572 | A1 | 6/2006 | Arikado et al. |
| 2006/0151808 | A1 | 7/2006 | Chen et al. |
| 2006/0153995 | A1 | 7/2006 | Narwankar et al. |
| 2006/0166475 | A1 | 7/2006 | Mantl |
| 2006/0214212 | A1 | 9/2006 | Horita et al. |
| 2006/0258156 | A1 | 11/2006 | Kittl |
| 2007/0001173 | A1 | 1/2007 | Brask et al. |
| 2007/0004218 | A1 | 1/2007 | Lee et al. |
| 2007/0015334 | A1 | 1/2007 | Kittl et al. |
| 2007/0020827 | A1 | 1/2007 | Buh et al. |
| 2007/0024349 | A1 | 2/2007 | Tsukude |
| 2007/0029576 | A1 | 2/2007 | Nowak et al. |
| 2007/0048907 | A1 | 3/2007 | Lee et al. |
| 2007/0076477 | A1 | 4/2007 | Hwang et al. |
| 2007/0093010 | A1 | 4/2007 | Mathew et al. |
| 2007/0093036 | A1 | 4/2007 | Cheng et al. |
| 2007/0096148 | A1 | 5/2007 | Hoentschel et al. |
| 2007/0120156 | A1 | 5/2007 | Liu et al. |
| 2007/0122953 | A1 | 5/2007 | Liu et al. |
| 2007/0122954 | A1 | 5/2007 | Liu et al. |
| 2007/0128782 | A1 | 6/2007 | Liu et al. |
| 2007/0132053 | A1 | 6/2007 | King et al. |
| 2007/0145487 | A1 | 6/2007 | Kavalieros et al. |
| 2007/0152276 | A1 | 7/2007 | Arnold et al. |
| 2007/0166929 | A1 | 7/2007 | Matsumoto et al. |
| 2007/0178637 | A1 | 8/2007 | Jung et al. |
| 2007/0221956 | A1 | 9/2007 | Inaba |
| 2007/0236278 | A1 | 10/2007 | Hur et al. |
| 2007/0241414 | A1 | 10/2007 | Narihiro |
| 2007/0247906 | A1 | 10/2007 | Watanabe et al. |
| 2007/0254440 | A1 | 11/2007 | Daval |
| 2008/0001171 | A1 | 1/2008 | Tezuka et al. |
| 2008/0036001 | A1 | 2/2008 | Yun et al. |
| 2008/0042209 | A1 | 2/2008 | Tan et al. |
| 2008/0050882 | A1 | 2/2008 | Bevan et al. |
| 2008/0085580 | A1 | 4/2008 | Doyle et al. |
| 2008/0085590 | A1 | 4/2008 | Yao et al. |
| 2008/0095954 | A1 | 4/2008 | Gabelnick et al. |
| 2008/0102586 | A1 | 5/2008 | Park |
| 2008/0124878 | A1 | 5/2008 | Cook et al. |
| 2008/0227241 | A1 | 9/2008 | Nakabayashi et al. |
| 2008/0265344 | A1 | 10/2008 | Mehrad et al. |
| 2008/0290470 | A1 | 11/2008 | King et al. |
| 2008/0296632 | A1 | 12/2008 | Moroz et al. |
| 2008/0318392 | A1 | 12/2008 | Hung et al. |
| 2009/0026540 | A1 | 1/2009 | Sasaki et al. |
| 2009/0039388 | A1 | 2/2009 | Teo et al. |
| 2009/0066763 | A1 | 3/2009 | Fujii et al. |
| 2009/0155969 | A1 | 6/2009 | Chakravarti et al. |
| 2009/0166625 | A1 | 7/2009 | Ting et al. |
| 2009/0181477 | A1 | 7/2009 | King et al. |
| 2009/0200612 | A1 | 8/2009 | Koldiaev |
| 2009/0239347 | A1 | 9/2009 | Ting et al. |
| 2009/0321836 | A1 | 12/2009 | Wei et al. |
| 2010/0055870 | A1* | 3/2010 | Katou .................. 438/455 |

(56) References Cited

U.S. PATENT DOCUMENTS

| | | | |
|---|---|---|---|
| 2010/0155790 | A1 | 6/2010 | Lin et al. |
| 2010/0163926 | A1 | 7/2010 | Hudait et al. |
| 2010/0187613 | A1 | 7/2010 | Colombo et al. |
| 2010/0207211 | A1 | 8/2010 | Sasaki et al. |
| 2010/0308379 | A1 | 12/2010 | Kuan et al. |
| 2010/0320416 | A1* | 12/2010 | Savu et al. ............... 252/79.3 |
| 2011/0018065 | A1 | 1/2011 | Curatola et al. |
| 2011/0108920 | A1 | 5/2011 | Basker et al. |
| 2011/0129990 | A1 | 6/2011 | Mandrekar et al. |
| 2011/0195555 | A1 | 8/2011 | Tsai et al. |
| 2011/0195570 | A1 | 8/2011 | Lin et al. |
| 2011/0256682 | A1 | 10/2011 | Yu et al. |
| 2011/0308603 | A1* | 12/2011 | Vermang et al. ............ 136/256 |
| 2012/0086053 | A1 | 4/2012 | Tseng et al. |
| 2012/0208302 | A1* | 8/2012 | Itoh et al. ....................... 438/9 |
| 2012/0208375 | A1* | 8/2012 | Ohmi et al. .................. 438/785 |

FOREIGN PATENT DOCUMENTS

| | | |
|---|---|---|
| CN | 1011459116 | 6/2009 |
| JP | 2007-194336 | 8/2007 |
| KR | 10-2005-0119424 | 12/2005 |
| KR | 1020070064231 | 6/2007 |
| TW | 497253 | 8/2002 |
| WO | WO2007/115585 | 10/2007 |

OTHER PUBLICATIONS

McVittie, James P., et al., "SPEEDIE: A Profile Simulator for Etching and Deposition", Proc. SPIE 1392, 126 (1991).

90 nm Technology. retrieved from the internet <URL:http://tsmc.com/english/dedicatedFoundry/technology/90nm.htm.

Merriam Webster definition of substantially retrieved from the internet <URL:http://www.merriam-webster.com/dictionary/substantial>.

Smith, Casey Eben, Advanced Technology for Source Drain Resistance, Diss. University of North Texas, 2008.

Liow, Tsung-Yang et al., "Strained N-Channel FinFETs Featuring in Situ Doped Silicon—Carbon Si1-YCy Source Drain Stressors with High Carbon Content", IEEE Transactions on Electron Devices 55.9 (2008): 2475-483.

Anathan, Hari, et al., "FinFet SRAM—Device and Circuit Design Considerations", Quality Electronic Design, 2004, Proceedings 5th International Symposium (2004); pp. 511-516.

Jha, Niraj, Low-Power FinFET Circuit Design, Dept. of Electrical Engineering, Princeton University n.d.

Kedzierski, J., et al., "Extension and Source/Drain Design for High-Performance FinFET Devices", IEEE Transactions on Electron Devices, vol. 50, No. 4, Apr. 2003, pp. 952-958.

Liow, Tsung-Yang et al., "Strained N-Channel FinFETs with 25 nm Gate Length and Silicon—Carbon Source/Drain Regions for Performance Enhancement", VLSI Technology, 2006, Digest of Technical Papers, 2006 Symposium on VLSI Technology 2006; pp. 56-57.

Shikida, Mitsuhiro et al., "Comparison of Anisotropic Etching Properties Between KOH and TMAH Solutions", Depto. of Micro System Engineering, Nagoya University, Chikusa, Nagoya, 464-8603, Japan, IEEE Jun. 30, 2010, pp. 315-320.

Lenoble, Damien, "Plasma Doping as an Alternative Route for Ultra Shallow Junction Integration to Standard CMOS Technologies", STMicroelectronics, Crolles Cedex, France, Semiconductor Fabtech, 16th Edition, pp. 1-5.

Chui, King-Jien et al., "Source/Drain Germanium Condensation for P-Channel Strained Ultra-Thin Body Transistors", Silicon Nano Device Lab, Dept. of Electrical and Computer Engineering, National University of Singapore, IEEE 2005.

* cited by examiner

METHOD OF FORMING SEMICONDUCTOR STRUCTURE

CROSS-REFERENCES TO RELATED APPLICATIONS

The present application claims priority of U.S. Application Ser. No. 61/405,858, filed on Oct. 22, 2010. The present application is a Continuation-in-part of U.S. patent application Ser. No. 12/687,574, filed Jan. 14, 2010, which is hereby incorporated by reference in its entirety.

The present application is related to U.S. patent application Ser. No. 12/707,788, filed on Feb. 18, 2010, titled MEMORY POWER GATING CIRCUIT AND METHODS; Ser. No. 12/758,426, filed on Apr. 12, 2010, titled FINFETS AND METHODS FOR FORMING THE SAME; Ser. No. 12/731,325, filed on Mar. 25, 2010, titled ELECTRICAL FUSE AND RELATED APPLICATIONS; Ser. No. 12/724,556, filed on Mar. 16, 2010, titled ELECTRICAL ANTI-FUSE AND RELATED APPLICATIONS; Ser. No. 12/757,203, filed on Apr. 9, 2010, titled STI STRUCTURE AND METHOD OF FORMING BOTTOM VOID IN SAME; Ser. No. 12/797,839, filed on Jun. 10, 2010, titled FIN STRUCTURE FOR HIGH MOBILITY MULTIPLE-GATE TRANSISTOR; Ser. No. 12/831,842, filed on Jul. 7, 2010, titled METHOD FOR FORMING HIGH GERMANIUM CONCENTRATION SiGe STRESSOR; Ser. No. 12/761,686, filed on Apr. 16, 2010, titled FINFETS AND METHODS FOR FORMING THE SAME; Ser. No. 12/766,233, filed on Apr. 23, 2010, titled FIN FIELD EFFECT TRANSISTOR; Ser. No. 12/757,271, filed on Apr. 9, 2010, titled ACCUMULATION TYPE FINFET, CIRCUITS AND FABRICATION METHOD THEREOF; Ser. No. 12/694,846, filed on Jan. 27, 2010, titled INTEGRATED CIRCUITS AND METHODS FOR FORMING THE SAME; Ser. No. 12/638,958, filed on Dec. 14, 2009, titled METHOD OF CONTROLLING GATE THICKNESS IN FORMING FINFET DEVICES; Ser. No. 12/768,884, filed on Apr. 28, 2010, titled METHODS FOR DOPING FIN FIELD-EFFECT TRANSISTORS; Ser. No. 12/731,411, filed on Mar. 25, 2010, titled INTEGRATED CIRCUIT INCLUDING FINFETS AND METHODS FOR FORMING THE SAME; Ser. No. 12/775,006, filed on May 6, 2010, titled METHOD FOR FABRICATING A STRAINED STRUCTURE; Ser. No. 12/886,713, filed Sep. 21, 2010, titled METHOD OF FORMING INTEGRATED CIRCUITS; Ser. No. 12/941,509, filed Nov. 8, 2010, titled MECHANISMS FOR FORMING ULTRA SHALLOW JUNCTION; Ser. No. 12/900,626, filed Oct. 8, 2010, titled TRANSISTOR HAVING NOTCHED FIN STRUCTURE AND METHOD OF MAKING THE SAME; Ser. No. 12/903,712, filed Oct. 13, 2010, titled FINFET AND METHOD OF FABRICATING THE SAME; 61/412,846, filed Nov. 12, 2010, 61/394,418, filed Oct. 19, 2010, titled METHODS OF FORMING GATE DIELECTRIC MATERIAL and 61/405,858, filed Oct. 22, 2010, titled METHODS OF FORMING SEMICONDUCTOR DEVICES; which are incorporated herein by reference in their entireties.

The present application is also related to U.S. application Ser. No. 12/789,681, entitled "Scaling EOT by Eliminating Interfacial Layers from High-K/Metal Gates of MOS Devices" filed on May 28, 2010, U.S. application Ser. No. 12/892,254, entitled "METHODS OF FORMING INTEGRATED CIRCUITS" filed on Sep. 28, 2010, and U.S. Provisional Application Ser. No. 61/394,418, entitled "METHODS OF FORMING GATE DIELECTRIC MATERIAL" filed on Oct. 19, 2010, which are incorporated herein by reference.

TECHNICAL FIELD

The present disclosure relates generally to the field of semiconductor devices.

BACKGROUND

The semiconductor integrated circuit (IC) industry has experienced rapid growth. Technological advances in IC materials and design have produced generations of ICs where each generation has smaller and more complex circuits than the previous generation. In the course of integrated circuit evolution, functional density (i.e., the number of interconnected devices per chip area) has generally increased while geometry size (i.e., the smallest component (or line) that can be created using a fabrication process) has decreased. However, these advances have increased the complexity of processing and manufacturing ICs. For example, the reliability and functional challenges of ultrathin gate oxides are becoming increasingly greater for increasingly small IC devices. Hence, reduction in interface defect density ($D_{it}$) at the substrate/oxide interface to increase carrier mobility and reduce current leakage, and reduction in capacitive effective thickness ($C_{ef}$) to increase scale, in current IC fabrication processes is highly desirable.

Therefore, while existing methods of fabricating semiconductor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
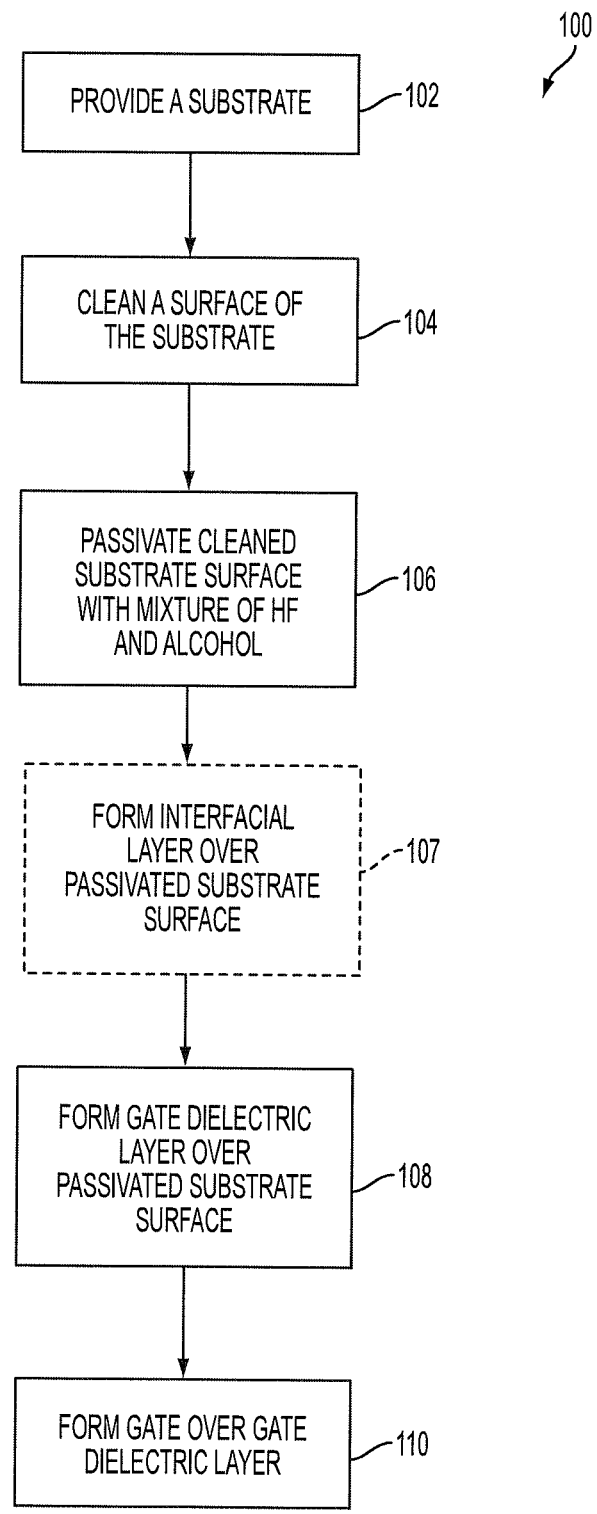
FIG. 1 is a flowchart illustrating a method of fabricating a semiconductor device according to various aspects of the present disclosure.

During the scaling trend, various materials have been implemented for the gate electrode and gate dielectric for complementary metal-oxide-semiconductor (CMOS) devices. CMOS devices have typically been formed with a gate oxide and polysilicon gate electrode. There has been a desire to replace the gate oxide and polysilicon gate electrode with a high dielectric constant (high-k) gate dielectric and metal gate electrode to improve device performance as feature sizes continue to decrease.

It is understood that the following disclosure provides many different embodiments, or examples, for implementing different features of various embodiments. Specific examples of components and arrangements are described below to further clarify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Illustrated in FIG. 1 is a flowchart of an example method 100 for fabricating a semiconductor device. FIGS. 2A-2J are diagrammatic fragmentary cross-sectional views of the semiconductor device during various fabrication stages. Illustrated in FIG. 3 is an example system 300 for fluorine-passivating a substrate of the semiconductor device. The semiconductor device may include an integrated circuit (IC) chip, system on chip (SoC), or portion thereof, that may include various passive and active microelectronic devices, such as resistors, capacitors, inductors, diodes, metal-oxide-semiconductor field effect transistors (MOSFET), CMOS transistors, bipolar junction transistors (BJT), laterally diffused MOS (LDMOS) transistors, high power MOS transistors, FinFET transistors, or other types of transistors. It is understood that FIGS. 2A-2J have been simplified for a better understanding of the embodiments of the present disclosure. Accordingly, it should be noted that additional processes may be provided before, during, and after the method 100 of FIG. 1, and that some other processes may only be briefly described herein.

Referring now to FIG. 1, the method 100 begins with block 102 in which a substrate is provided, for example in a spray chamber (312 in FIG. 3). The method 100 continues with block 104 in which a surface of the substrate is cleaned to remove particulates and/or contaminants, which may include organic and/or metallic materials. The cleaned surface of the substrate is then passivated by a mixture including fluorine and an alcohol, at block 106, to form a fluorine-passivated surface on the substrate. A gate dielectric layer is formed over the fluorine-passivated surface, as shown in block 108. An interfacial layer, for example a thin oxide, is optionally formed between the fluorine-passivated surface and the gate dielectric layer, as shown in block 107. A metal gate electrode is then formed over the gate dielectric layer, as shown in block 110.

Referring now to FIGS. 2A-2J in conjunction with FIG. 1, a semiconductor device 200 is fabricated in accordance with the method 100 of FIG. 1. The semiconductor device 200 has a substrate 201. The substrate 201 is a silicon substrate doped with a P-type dopant, such as boron (a P-type substrate). In some alternative embodiments, the substrate 201 could be another suitable semiconductor material. For example, the substrate 201 may be a silicon substrate that is doped with an N-type dopant, such as phosphorous or arsenic (an N-type substrate). In yet some other embodiments, the substrate 201 may alternatively be made of some other suitable elementary semiconductor, such as diamond or germanium; a suitable compound semiconductor, such as silicon carbide, silicon germanium, indium arsenide, or indium phosphide; or a suitable alloy semiconductor, such as silicon germanium carbide, gallium arsenic phosphide, or gallium indium phosphide. Further, the substrate 201 could include an epitaxial layer (epi layer), may be strained for performance enhancement, and may include a silicon-on-insulator (SOI) structure.

Shallow trench isolation (STI) features 202a, 202b may also be formed in the substrate 201. The STI features 202a, 202b are formed by etching recesses (or trenches) in the substrate 201 and filling the recesses with a dielectric material. In at least one embodiment, the dielectric material of the STI features 202a, 202b includes silicon oxide. In some alternative embodiments, the dielectric material of the STI features 202a, 202b may include silicon nitride, silicon oxynitride, fluoride-doped silicate (FSG), and/or a low-k dielectric material.

Figure 2A:
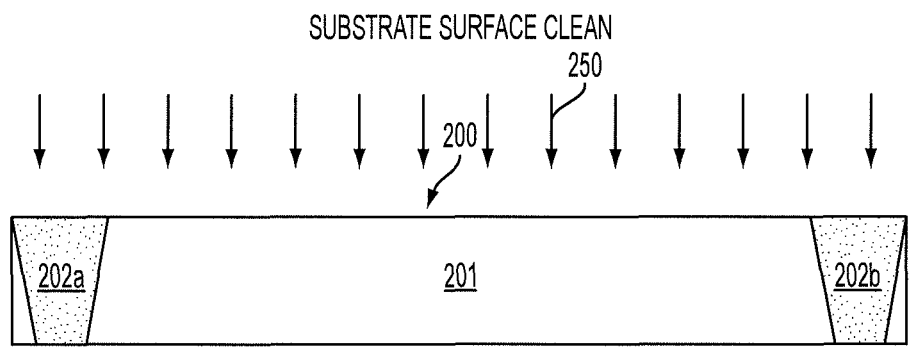
FIGS. 2A to 2J illustrate cross-sectional views of the semiconductor device at various stages of fabrication according to the method of FIG. 1.
Figure 3:
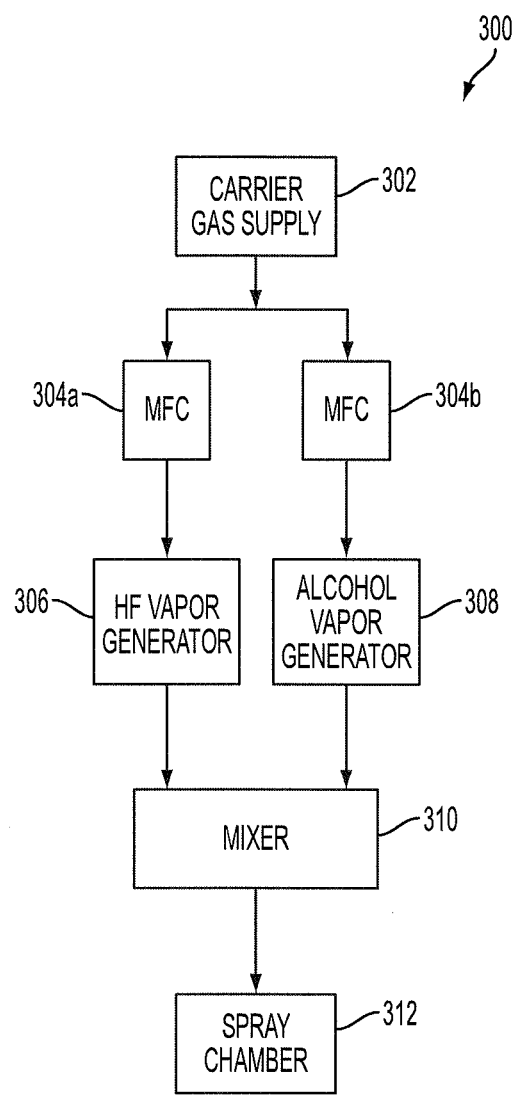
FIG. 3 is a block diagram illustrating a system for fluorine passivating a semiconductor substrate surface according to various aspects of the present disclosure.

Referring to FIG. 2A, a top surface of substrate 201 undergoes a surface cleaning process 250 (as shown by downward arrows) to remove particulates and/or contaminants, which may include organic and/or metallic materials. The cleaning process may include a variety of applicable chemicals and techniques, and in one example may include the use of hydrofluoric acid, ammonium hydroxide, hydrogen peroxide, hydrochloric acid, sulfuric acid, and/or ozone. In one example, the chemicals may be utilized in a wet dip or liquid, vapor and/or heated environment to clean the substrate surface. In yet another example, standard RCA, sulfuric-peroxide mixture (SPM), standard clean 1 (SC1), and/or standard clean 2 (SC2) chemicals and processes may be used to clean the substrate surface.

Figure 2B:
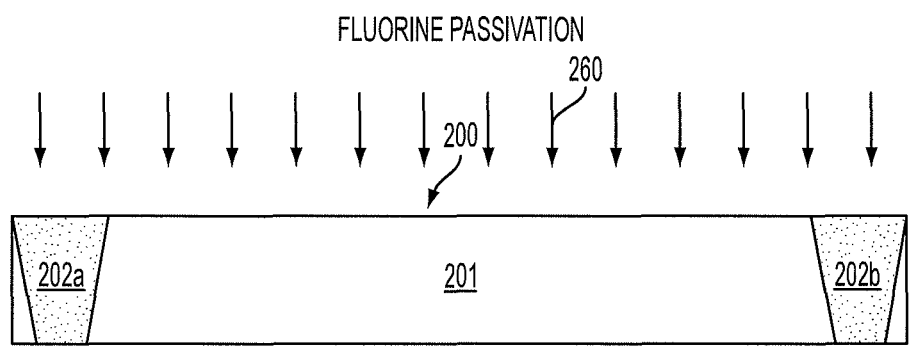
Figure 2C:
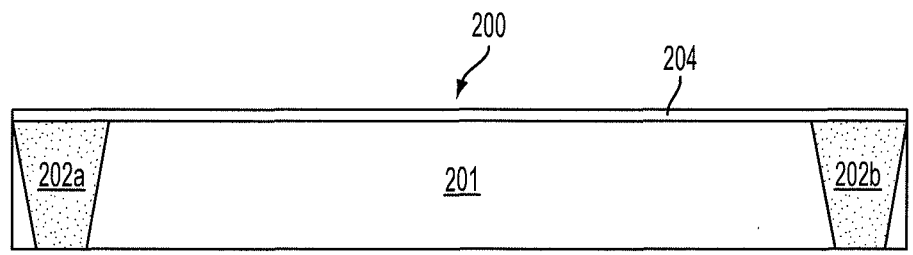

Thereafter, as shown in FIG. 2B, the cleaned surface of the substrate 201 undergoes a fluorine passivation process 260 (as shown by downward arrows) to form a fluorine-passivated surface 204 over the bulk substrate 201 and the STI features 202a, 202b, as shown in FIG. 2C.

In the present embodiment, substrate 201 is passivated by a mixture including fluorine and alcohol, such as isopropyl alcohol (IPA), methanol, or ammonia. In an example, the mixture may include a hydrous hydrofluoric acid vapor and an IPA vapor supplied by a carrier gas such as nitrogen. In another example, the passivation mixture includes about 10 percent of weight-percentage (wt %) to about 80 wt % of hydrous hydrofluoric acid vapor, for example including hydrofluoric acid at about 49 wt %. In another example, the passivation mixture includes hydrofluoric acid vapor and IPA vapor at a weight ratio of around 0.5/1 to 10/1, for example around 3/1. In yet another example, the mixture may include hydrofluoric acid and alcohol in a different form, such as a liquid or aqueous form of HF and IPA. In yet another example, the mixture may include hydrofluoric acid and ammonia ($NH_3$). Other carrier gases which are essentially non-reactive with silicon, such as argon, may be suitable. In another embodiment, fluorine-passivated surface 204 includes carbon, oxygen, fluorine, and silicon atoms, and the fluorine passivation process is tuned to form the fluorine-passivated surface 204 to include fluorine at an atomic concentration greater than 2% and/or to minimize the atomic concentration of carbon and oxygen residue at the fluorine-passivated surface. The amount of hydrofluoric acid and alcohol provided in the passivation mixture may be used to tune the fluorine passivation process.

In some embodiments, fluorine passivation process 260 is performed at a temperature ranging from ambient temperature to about 100 degrees Celsius and under a pressure ranging from atmospheric pressure to about 300 torr in one embodiment, and does not require high temperature implantation, annealing, UV light, or plasma processing, thereby avoiding interface defects that may occur from those processes. In at least another embodiment, fluorine passivation 260 may be performed at a temperature ranging from ambient temperature about 100 degrees Celsius and under a pressure ranging from 1 milli-torr (mtorr) to about 10 torr, and then with a baking process from about 50 to about 200 degrees.

Figure 2D:
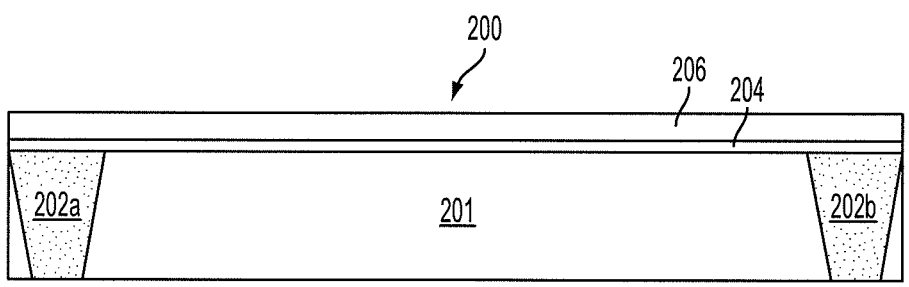

Thereafter, an interfacial layer 206 is optionally formed over the fluorine-passivated surface 204, as shown in FIG. 2D. In one example, the interfacial layer 206 is formed by an atomic layer deposition (ALD) process and includes silicon oxide ($SiO_2$). In another example, the interfacial layer 206 is grown in an oxygen environment below 1000 degrees Celsius, and in another example below 850 degrees Celsius. The interfacial layer 206 has a thickness less than about 1 nanometers (nm), and in one embodiment, may be in a range from approximately 0.3 nm to approximately 1 nm.

Figure 2E:
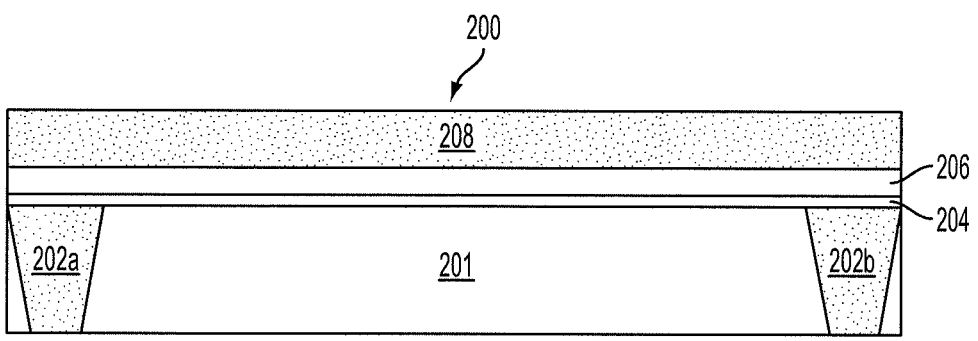

A dielectric layer 208 is then formed over the interfacial layer 206, as shown in FIG. 2E. However, as noted above, interfacial layer 206 is optional and the dielectric layer 208 may be formed over the fluorine-passivated surface 204 without an intervening interfacial layer. In one example, the dielectric layer 208 is formed by an ALD process and includes a high-k dielectric material. A high-k dielectric material is a material having a dielectric constant that is greater than a dielectric constant of $SiO_2$, which is approximately 4. In an embodiment, the dielectric layer 208 includes hafnium oxide ($HfO_2$), which has a dielectric constant that is in a range from approximately 18 to approximately 40. The dielectric layer 208 has a thickness that is greater than the interfacial layer 206, and in one embodiment, may be in a range from about 1 nanometer to about 3 nanometers. In some alternative embodiments, the dielectric layer 208 may include one or more of AlO, HfO, ZrO, $ZrO_2$, ZrSiO, YO, $Y_2O_3$, LaO, $La_2O_5$, GdO, $Gd_2O_5$, TiO, $TiO_2$, TiSiO, TaO, $Ta_2O_5$, TaSiO, HfErO, HfLaO, HfYO, HfGdO, HfAlO, HfZrO, HfTiO, HfTaO, HfSiO, SrTiO, ZrSiON, HfZrTiO, HfZrSiON, HfZrLaO, HfZrAlO, or other applicable dielectric materials.

Figure 2F:
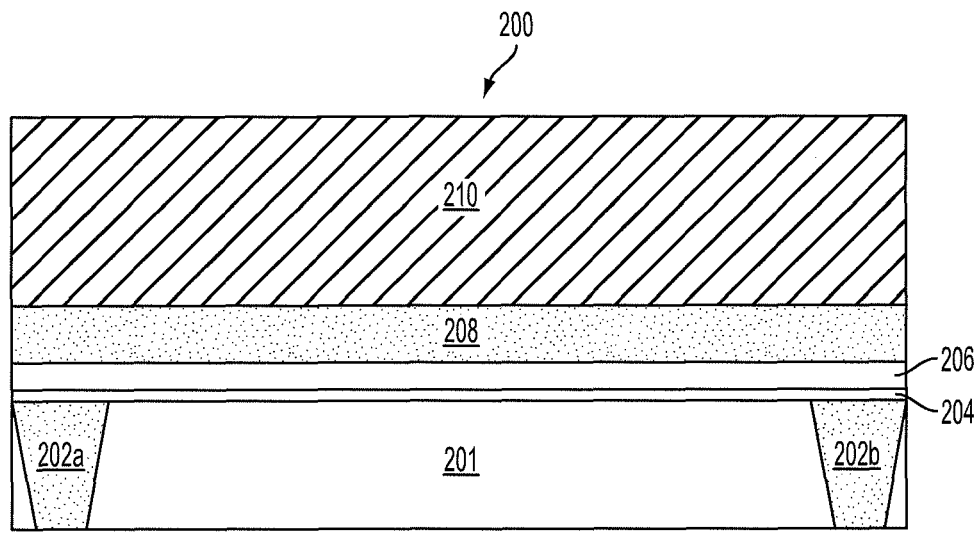

Referring now to FIG. 2F, a gate electrode layer 210 is formed over the gate dielectric layer 208. The gate electrode layer 210 may include a metallic material, such as TiN, TaN, TaC, TaSiN, WN, TiAl, tungsten (W), aluminum (Al), copper (Cu), or combinations thereof; or a polysilicon material for a dummy gate or a polysilicon gate electrode. The metal gate electrode layer 210 may be formed by chemical vapor deposition (CVD), physical vapor deposition (PVD), or another suitable technique. The metal layer is a small portion of the gate electrode layer 210 in a gate first process flow.

Figure 2G:
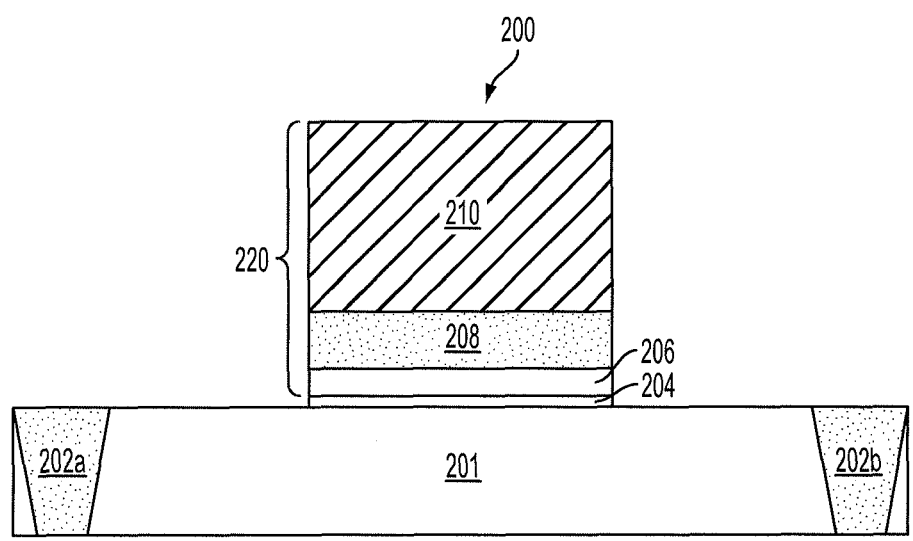

Referring to FIG. 2G, the fluorine-passivated surface 204, the interfacial layer 206, the gate dielectric layer 208, and the gate electrode layer 210 are patterned using a photolithography process to form a gate structure 220 (also referred to as a gate stack) of the semiconductor device 200. A portion of the fluorine-passivated surface 204 that is over the STI structures 202a, 202b is also removed during this step, with the fluorine-passivated surface advantageously reducing loss of dielectric material from the STI structures during an etching or patterning process. In another embodiment, the gate stack with fluorined-passivated surface is formed in gate-last process flow (replacement gate flow).

Figure 2H:
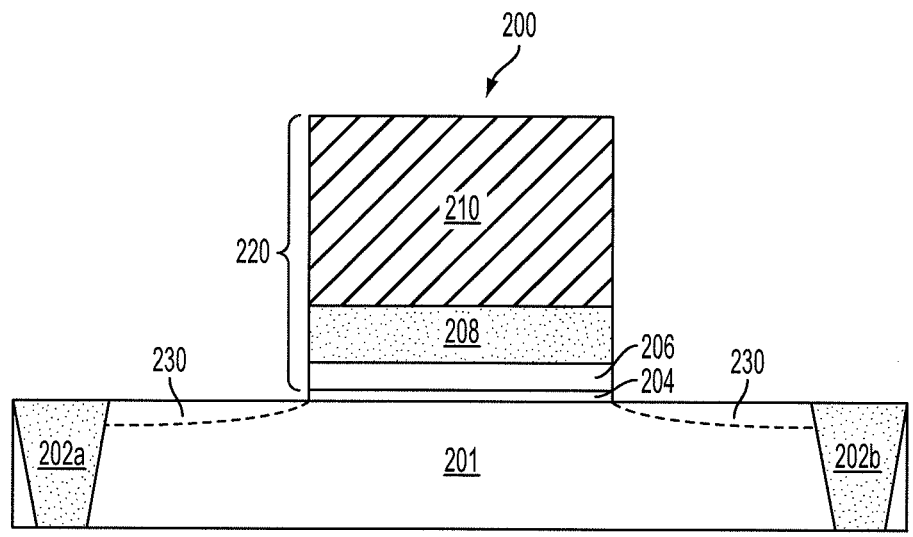

Referring to FIG. 2H, after the gate structure 220 is formed, lightly doped source/drain (also referred to as LDD) regions 230 may be formed in portions of the substrate 201 on either side of the gate structure 220. The LDD regions may be formed by an ion implantation process or a diffusion process. N-type dopants, such as phosphorus or arsenic, may be used to form the semiconductor device 200 as an NMOS device, and P-type dopants, such as boron, may be used to form the semiconductor device 200 as a PMOS device.

Figure 2I:
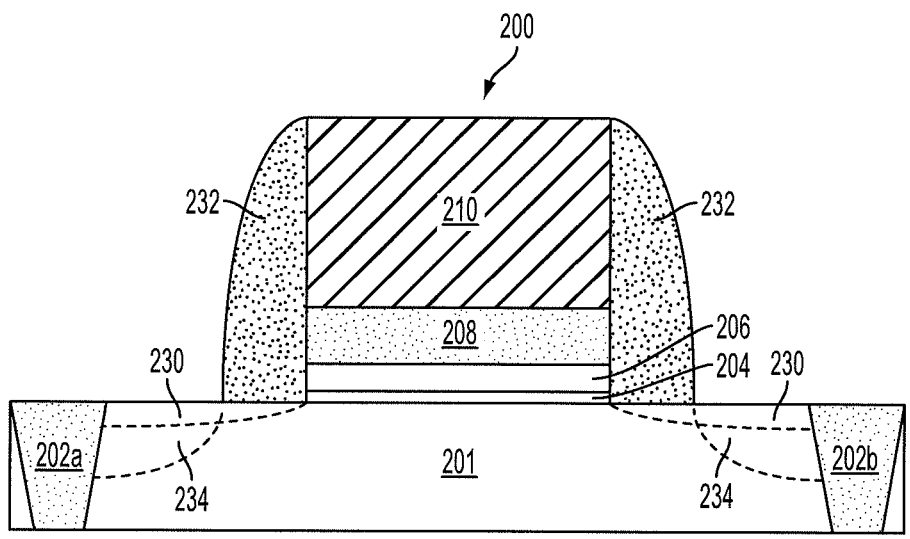

Gate spacers 232 may then be formed over the substrate and on either side of the gate structure 220 using a deposition process and an etching process (for example, an anisotropic etching process), as shown in FIG. 2I. The gate spacers 232 include a suitable dielectric material, such as silicon nitride, silicon oxide, silicon carbide, silicon oxy-nitride, or combinations thereof. Thereafter, heavily doped source and drain regions 234 (also referred to as active regions) are formed in portions of the substrate on either side of the structure of combined gate structure 220 and gate spacers 232. The active regions 234 may be formed by an ion implantation process or a diffusion process. N-type dopants, such as phosphorus or arsenic, may be used to form the semiconductor device 200 as an NMOS device, and P-type dopants, such as boron, may be used to form the semiconductor device 200 as a PMOS device. The active regions 234 are aligned with the gate spacers 232.

Figure 2J:
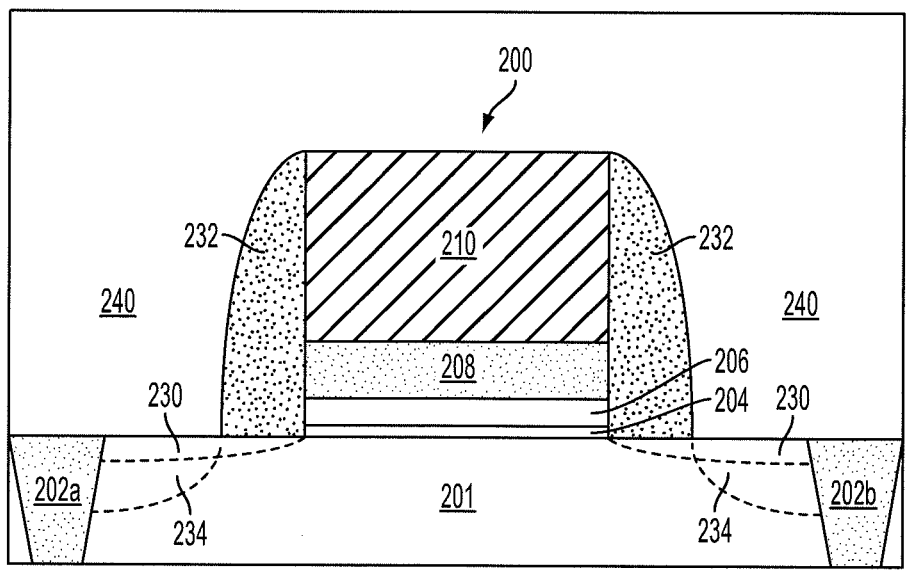

An inter-layer (or inter-level) dielectric (ILD) layer 240 is then formed over the substrate and the gate structure, as shown in FIG. 2J. The ILD layer 240 may be formed by chemical vapor deposition (CVD), high density plasma CVD, spin-on, sputtering, or other suitable methods. In at least one embodiment, the ILD layer 240 includes silicon oxide. In some alternative embodiments, the ILD layer 240 could include silicon oxy-nitride, silicon nitride, or a low-k material.

Although not illustrated, one or more annealing processes are performed on the semiconductor device to activate the active regions. These annealing processes may have relatively high temperatures (such as temperatures greater than approximately 700 degrees Celsius) and may be performed before or after a CMP process on the ILD layer 240. Advantageously, the gate dielectric layer is capable of withstanding high annealing temperatures without crystallizing, thus reducing potential gate leakage current.

Thus, FIGS. 2A-2J illustrate the various stages of a "gate first" process. Additional processes may be performed to complete the fabrication of the semiconductor device 200, such as the forming of an interconnect structure and other backend structures known in the art. For the sake of simplicity, these processes are not illustrated herein.

In another process flow, gate stack could be formed on fluorine passivated surface after removing dummy gate electrode in replacement process flow.

As described above, it is understood that the gate electrode layer 210 may either be used in a "gate first" process, or the gate electrode layer 210 may also be used as a dummy gate electrode in a "gate last" process. For example, if gate electrode 210 of FIGS. 2F-2J was formed of a polysilicon material, a chemical-mechanical-polishing (CMP) process could be performed on the ILD layer 240 of FIG. 2J to expose a top surface of the gate structure 220. Following the CMP process, the top surface of the gate structure 220 is substantially coplanar with the top surface of the ILD layer 240 on either side of the gate structure 220. Although not illustrated, one or more annealing processes are performed on the semiconductor device to activate the active regions 234. These annealing processes may have relatively high temperatures (such as temperatures greater than approximately 700 degrees Celsius) and may be performed before or after the CMP process. As discussed above, the gate dielectric layer 208 is capable of withstanding such high annealing temperatures without crystallizing, thus reducing potential gate leakage current. Afterwards, the gate electrode 210 is removed, thereby forming a trench in place of the gate electrode 210. The gate electrode 210 may be removed in a wet etching or a dry etching process, while the rest of the layers of the semiconductor device remain substantially un-etched. Since the polysilicon gate electrode 210 is removed in the gate last process, it is also referred to as a "dummy gate." Finally, a metal layer is formed within the trench and over the gate dielectric layer 208.

It is understood that additional processes may be performed to complete the fabrication of the semiconductor device 200. For example, these additional processes may include deposition of passivation layers, formation of contacts, and formation of interconnect structures (e.g., lines and vias, metal layers, and interlayer dielectric that provide electrical interconnection to the device including the formed metal gate). For the sake of simplicity, these additional processes are not described herein.

The fluorine-passivated surface 204 of substrate 201 offers many advantages, and it is understood that different embodiments may offer different advantages, and that no particular advantage is necessarily required for all embodiments. One of the advantages offered by the fluorine-passivation process of the present disclosure is to have lower interface defect density ($D_{it}$), which allows for enhanced insulation and function of the gate oxide to increase carrier mobility, and increase device reliability. As noted above, high temperature implantation/doping and annealing processes are avoided thereby decreasing $D_{it}$ maintaining dielectric constants of the gate oxide layers, and also reducing thermal budget for the device fabrication. A further advantage of the fluorine-passivation process of the present disclosure is reduced current effective thickness ($C_{et}$) of the gate oxide layers to improve scale in IC device fabrication. As noted above, the optional interfacial layer 206 is less than 1 nm, and in the present embodiment, in a range of between about 0.3 nm and 1 nm, and the dielectric layer 208 is between about 1 nm and 3 nm. It has been further observed that fluorine-passivation of the substrate surface also allows for effective atomic layer deposition of a gate oxide layer (e.g., a high-k oxide) at the fluorine-passivated surface.

Accordingly, the present disclosure achieves a reduced gate leakage current. Also, the overall thickness of gate oxide layers 206 and 208 are reduced without doping that would lower the dielectric constant values of gate oxide layers 206 and 208. Hence, the present disclosure offers desired advantages of lower leakage current without sacrificing either the overall thickness or the dielectric constant of the gate oxide.

Referring now to FIG. 3, a system 300 for fluorine-passivating a substrate of the semiconductor device includes, in at least one embodiment, a carrier gas supply 302, two mass flow controllers 304a, 304b operably coupled to the carrier gas supply 302, a HF vapor generator 306 operably coupled to MFC 304a, an alcohol vapor generator 308 operably coupled to MFC 304b, a mixer 310 operably coupled to Hydrogen Fluoride (HF) vapor generator 306 and alcohol vapor generator 308, and a spray chamber 312 operably coupled to mixer 310. Controlled amounts of carrier gas, such as nitrogen, from carrier gas supply 302, is supplied to HF vapor generator 306 and alcohol vapor generator 308 by MFCs 304a and 304b, respectively, to supply controlled amounts of the HF vapor and the alcohol vapor into mixer 310. Mixer 310 then provides the fluorine-passivation mixture of HF vapor and alcohol vapor to the spray chamber 312, where the mixture is used to passivate the substrate surface of the semiconductor device at room temperature and atmospheric pressure. MFCs 304a, 304b may be used to tune the fluorine-passivation process to provide a desired concentration of fluorine at the passivated surface and/or to minimize concentrations of carbon and oxygen at the passivated surface.

In one example, the flowrate of HF vapor was between about 500 and about 10000 milli-liter (ml) in carrier gas of per liter of nitrogen per minute and the flowrate of IPA vapor was between about 1000 and about 10000 ml in carrier gas of per liter of nitrogen per minute provided to mixer 310. The substrate surface was then processed by the passivation mixture for between 10 and 200 seconds at room temperature and atmospheric pressure in spray chamber 312. In another example, about 6 ml of HF vapor per liter of nitrogen per minute and about 2 ml of IPA vapor per liter of nitrogen per minute were provided to mixer 310. The substrate surface was then processed by the passivation mixture for a process time range from 10 to 200 seconds at room temperature and atmospheric pressure in spray chamber 312.

Figure 4:
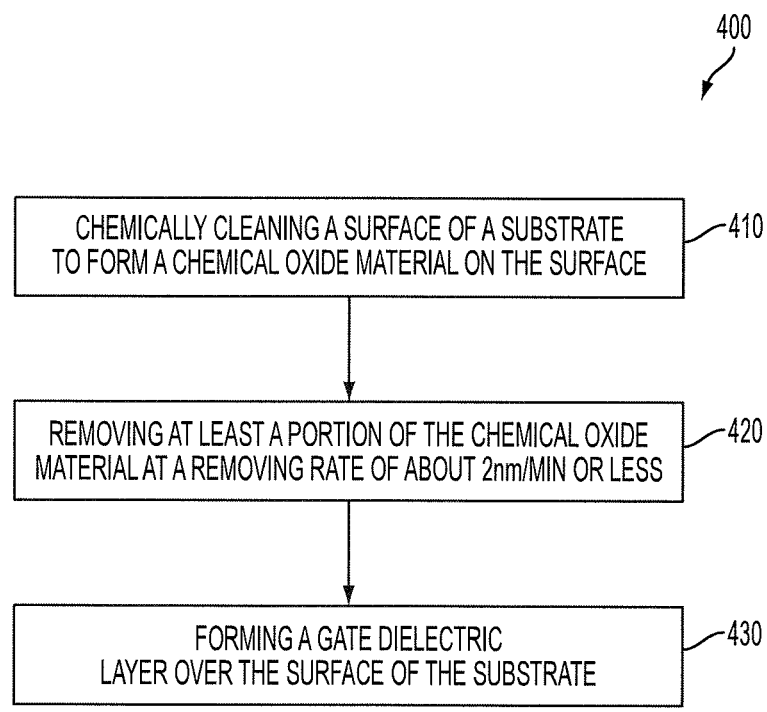
FIG. 4 is a flow chart illustrating an exemplary method of forming a semiconductor device.

FIG. 4 is a schematic drawing illustrating an exemplary method of forming a semiconductor device. In some embodiment, a method 400 of forming a semiconductor device can include block 410 in which chemically cleaning a surface of a substrate to form a chemical oxide material on the surface. The method 400 can continue with block 420 in which at least a portion of the chemical oxide material is removed at a removing rate of about 2 nanometer/minute (nm/min) or less. Thereafter, the method 400 can include forming a gate dielectric layer over the surface of the substrate 430.

In some embodiments, chemically cleaning a surface of a substrate in block 410 can be similar to cleaning a surface of the substrate in block 104 described above in conjunction with FIG. 1. As noted, the surface clean 250 (shown in FIG. 2A) can include at least one of a standard RCA cleaning process, a SPM cleaning process, an SC1 cleaning process, and a SC2 cleaning process. The surface clean 250 can form a chemical oxide material on the surface of the substrate 201. The chemical oxide material is formed substantially by a chemical reaction of the chemicals of the surface clean 250 and the surface of the substrate 201.

In some embodiments, removing at least a portion of the chemical oxide material in block 420 can be carried out by fluorine passivation process 260 described above in conjunction with FIG. 2B. In some embodiments, the removing process can have a removing rate of about 2 nm/min or less. In other embodiments, the removing rate can be about 1 nm/min or less. It is noted that the slow removing rate can desirably remove the chemical oxide material and/or avoid substantially damage the surface of the substrate 201.

In some embodiments, removing at least a portion of the chemical oxide material can include rotating the substrate 201. In some embodiments, rotating the substrate 201 can have a rotational speed of about 100 rounds per minute (RPM) or less. In some other embodiments, the rotational speed can range from about 100 RPM to about 10 RPM.

While rotating the substrate 201, removing at least a portion of the chemical oxide can include providing a hydrogen-fluoride-containing (HF-containing) gas to remove at least a portion of the chemical oxide material. In some embodiments, the HF-containing gas can be similar to the passivation mixture described above in conjunction with FIG. 2B.

In some embodiments, providing the HF-containing gas can include providing a carrier gas to a tank containing an HF-containing acid so as to carry an HF-containing vapor from the tank. For example, a carrier gas, e.g., $N_2$ and/or Ar, can be injected into the HF vapor generator 306 described above in conjunction with FIG. 3. The HF vapor generator 306 can be configured to store the HF-containing acid. The carrier gas can carry the saturated vapor of the HF-containing acid from the HF vapor generator 306.

In some embodiments, another carrier gas can be provided to another tank containing a solvent so as to carry a solvent vapor from the tank. For example, a carrier gas, e.g., $N_2$ and/or Ar, can be injected into the alcohol vapor generator 308 described above in conjunction with FIG. 3. The alcohol vapor generator 308 can be configured to store a solvent, e.g., IPA solvent. The carrier gas can carry the saturated vapor of the IPA solvent from the alcohol vapor generator 308. The IPA vapor is provided to the mixture 310 for diluting the HF-containing vapor. In some embodiments, the method 400 can include diluting the HF-containing vapor by increasing a flowing rate of at least one the carrier gases provided to the HF vapor generator 306 and the alcohol vapor generator 308.

Referring again to FIG. 4, the method 400 can include forming a gate dielectric layer over the surface of the substrate in block 430. In some embodiments, forming the gate dielectric layer can be similar to forming the gate dielectric layer of block 108 and/or forming the interfacial layer 107 described above in conjunction with FIG. 1.

Figure 5:
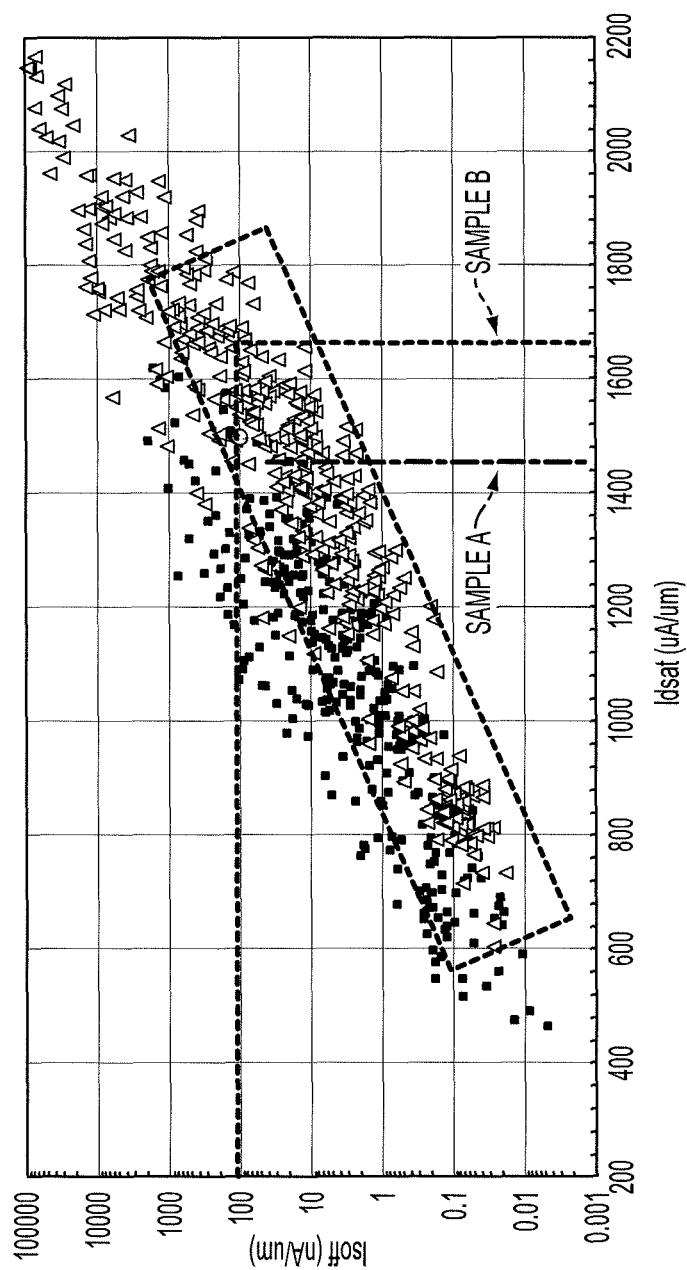
FIG. 5 is a chart illustrating leakage currents and on-currents of transistor samples by a conventional method and an exemplary method of the current application.

FIG. 5 is a chart illustrating leakage currents and on-currents of transistor samples by a conventional method and an exemplary method of the current application. In FIG. 5, sample A is prepared by a RCA process before the formation of the gate dielectric layer. Sample B is prepared by the method 400 described above in conjunction with FIG. 4. As shown, having the same leakage current level, Sample B has an on-current that is substantially larger than that of Sample A. In other words, Sample B has a leakage current and an interface defect density that are lower than those of Sample A.

Figure 6:
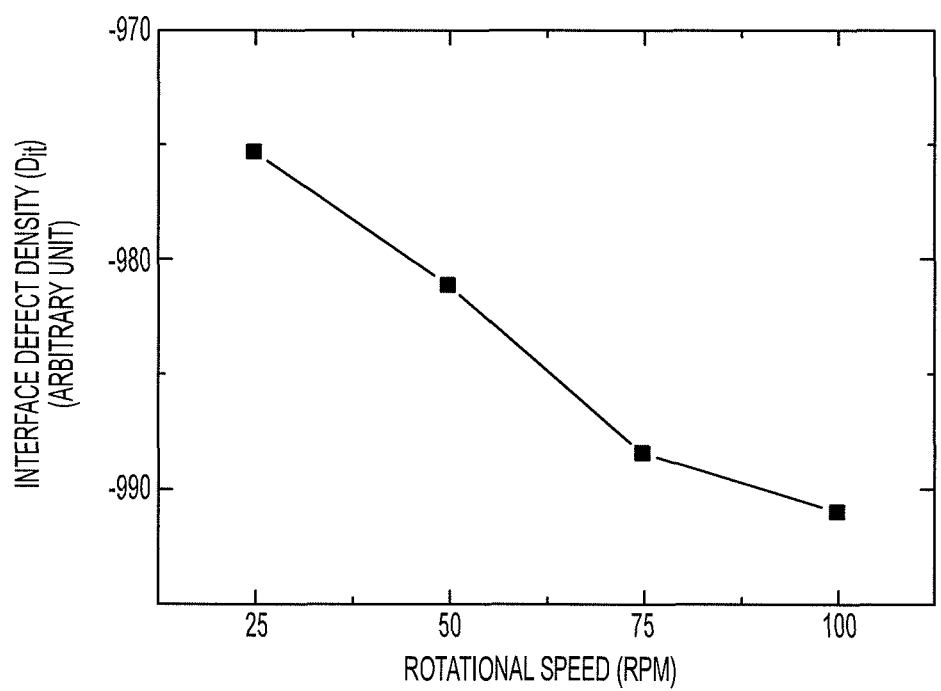
FIG. 6 is a chart illustrating a relationship between interface defect densities and rotational speeds.

FIG. 6 is a chart illustrating a relationship between interface defect densities and rotational speeds. In FIG. 6, the horizontal axis represents the rotational speed and the vertical axis represents the charges of the interfacial defect density ($D_{it}$). As shown in FIG. 6, if the rotational speed is slowed down from about 100 RPM to about 10 RPM, the interface defect density is decreased.

Figure 7:
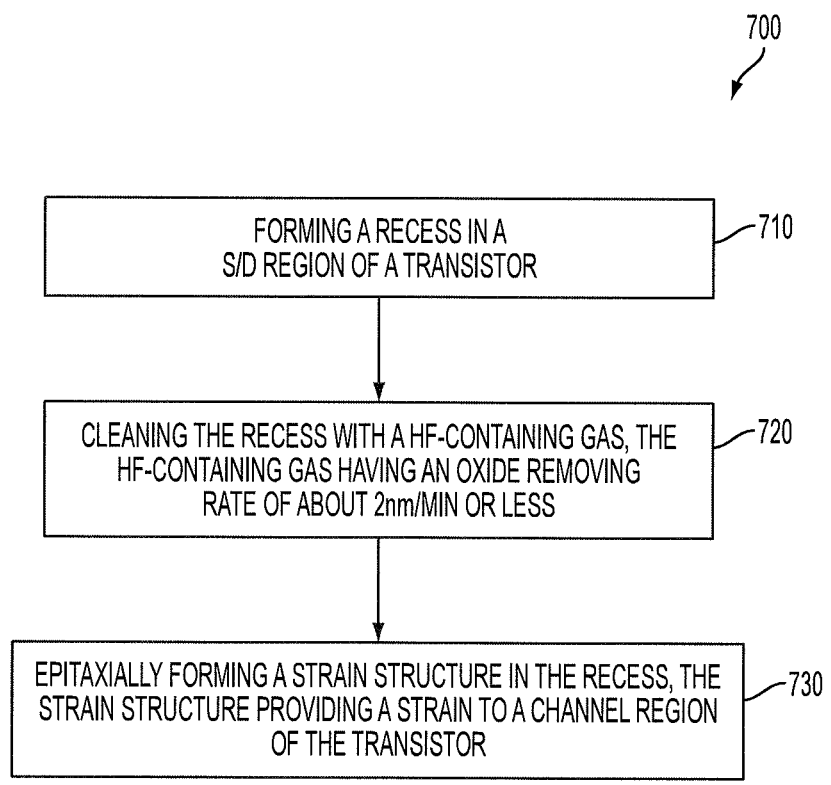
FIG. 7 is a flowchart showing an example method for fabricating a semiconductor device.
Figure 8A:
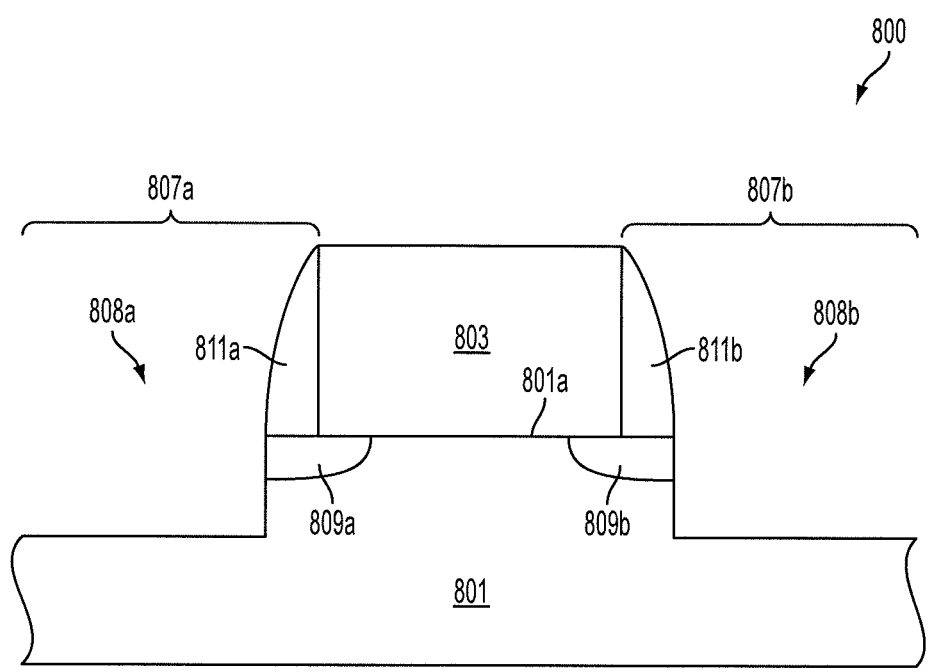
FIGS. 8A-8C are diagrammatic fragmentary cross-sectional views of a semiconductor device during various fabrication stages according to the method of FIG. 7.
Figure 8B:
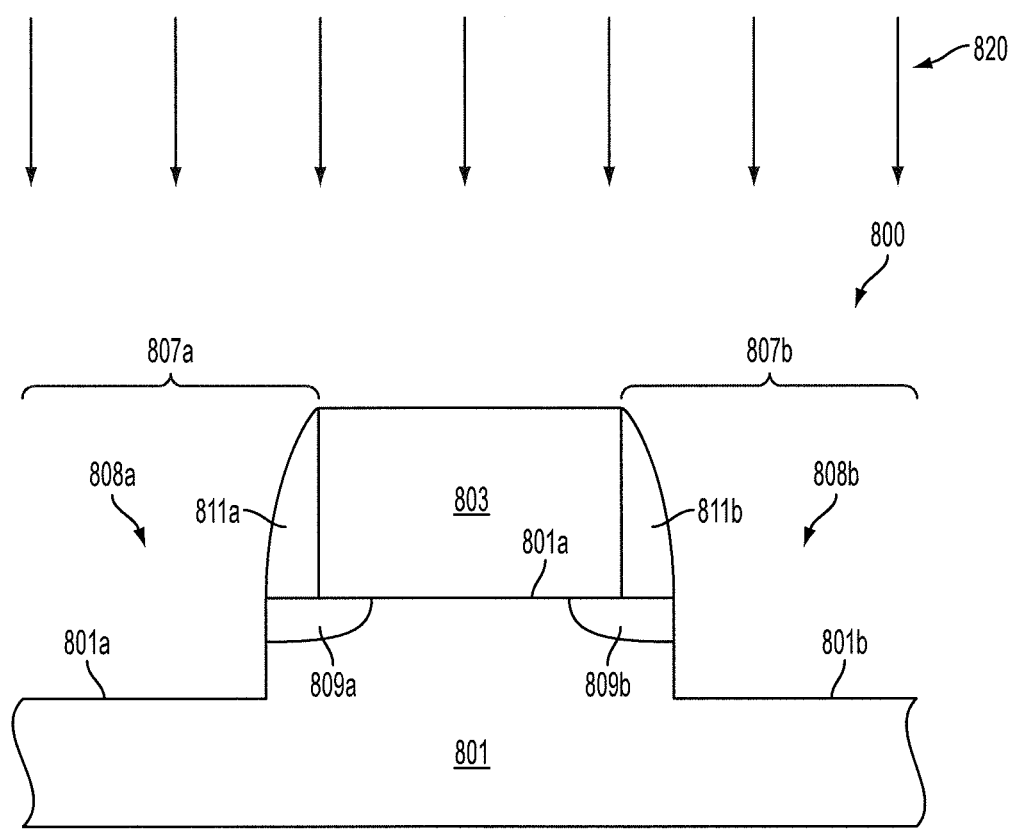
Figure 8C:
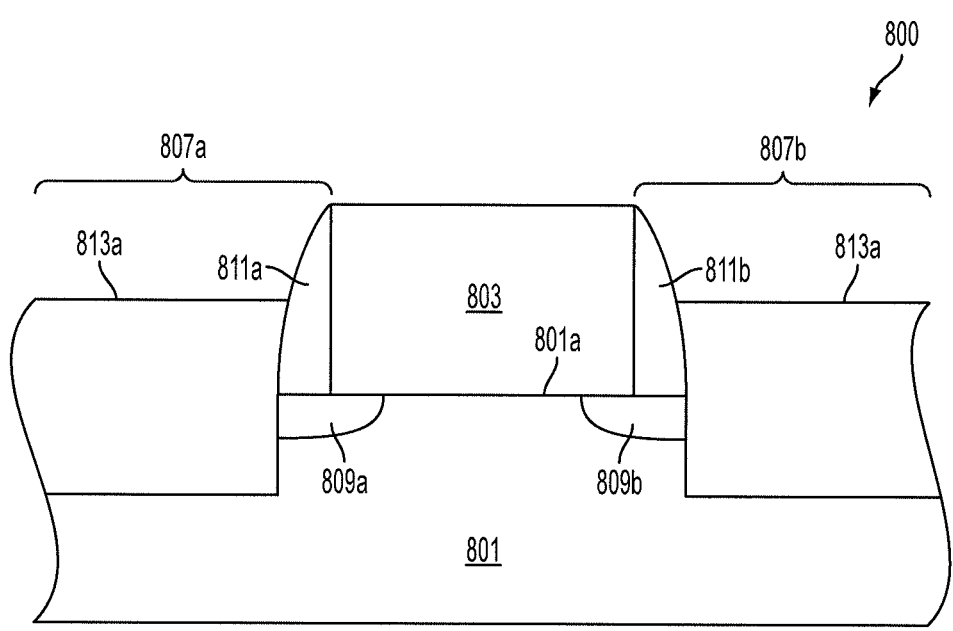

FIG. 7 is a flowchart showing an example method 700 for fabricating a semiconductor device. FIGS. 8A-8C are diagrammatic fragmentary cross-sectional views of the semiconductor device during various fabrication stages. In FIG. 7, a method 700 of forming a semiconductor device can include forming a recess in a source/drain (S/D) region of a transistor in block 710. The method 700 can include block 720 in which the recess is cleaned with a HF-containing gas, the HF-containing gas having an oxide removing rate of about 2 nm/min or less. After the cleaning process, the method 700 can include block 730 in which a strain structure is epitaxially formed in the recess for providing a strain to a channel region of the transistor.

Referring to FIGS. 7 and 8A, a recess can be formed in a source/drain (S/D) region of a transistor in block 710. For example, recesses 808a and 808b can be formed in S/D regions 807a and 807b, respectively, of a transistor 800. The recesses 808a and 808b can be formed by, for example, a dry etch process. In some embodiments, the transistor 800 can include a gate structure 803 formed over a substrate 801. The substrate 801 can be similar to the substrate 201 described above in conjunction with FIG. 2A.

In some embodiments, the gate structure 803 can be a conductive gate structure, e.g., a polysilicon gate structure, a metal gate structure, a dummy gate structure, or any suitable gate structure. For example, a conductive gate structure can have a stack structure including a gate dielectric layer, a conductive material layer, and/or other suitable layers. A metal gate structure can have a stack structure including a high dielectric constant gate layer, a diffusion barrier layer, a metal work function layer, a metallic layer, and/or other suitable layers. A dummy gate structure can have a stack structure including a dummy material layer, a hard mask layer, and/or other suitable layers.

In some embodiments, lightly-doped drains (LDDs) 809a and 809b can be formed in the substrate 801. Portions of the LDDs 809a and 809b can be formed under the gate structure 803. The LDDs 809a and 809b can be formed of n-type or p-type dopants (impurities). In some embodiments, at least one thermal annealing process, e.g., a rapid thermal annealing (RTA) process, can be performed to activate the dopants of the LDDs 809a and 809b. In some embodiments, the RTA process can have a spike annealing temperature of about 950° C.

In some embodiments, spacers 811a and 811b can be formed on the sidewalls of the gate structure 803. The spacers 811a and 811b can be made of at least one material, such as silicon oxide, silicon nitride, silicon oxynitride, other dielectric materials, and/or any combinations thereof. In some embodiments, the S/D regions 807a and 807b can be formed adjacent to sidewalls of the spacers 811a and 811b, respectively.

Referring to FIGS. 7 and 8B, the recess is cleaned with a HF-containing gas. For example, a cleaning process 820 can clean the recesses 808a and 808b with a HF-containing gas. The HF-containing gas can have an oxide removing rate of about 2 nm/min or less. In some embodiments, the cleaning process 820 can be similar to the fluorine passivation process 260 described above in conjunction with FIG. 2B and/or the removing process 420 described above in conjunction with FIG. 4. As shown in FIG. 8B, the cleaning process 820 can clean the surfaces 801a and 801b of the substrate 801. As noted, the cleaning process 820 can have a slow oxide removing rate of about 2 nm/min or less. The cleaning process 820 can desirably remove a native oxide and/or a chemical oxide on the surfaces 801a and 801b without substantially damaging the surfaces 801a and 801b. In other embodiments, the oxide removing rate can be about 1 nm/min or less.

Referring to FIGS. 7 and 8C, after the cleaning process, a strain structure is epitaxially formed in the recess for providing a strain to a channel region of the transistor in block 730. For example, strain structures 813a and 813b can be epitaxially formed in the recesses 808a and 808b, respectively, for providing a strain to a channel region of the transistor 800. In some embodiments forming a P-type transistor, the strain structures 813a and 813b can be made of a material, such as silicon-germanium (SiGe), for providing a compressive strain to the channel under gate structure 803. In other embodiments forming an N-type transistor, the strain structures 813a and 813 can be made of a material, such as silicon-carbide (SiC), for providing a tensile strain to the channel under gate structure 803. In some embodiments, the strain structures 813a and 813b can be formed by chemical vapor deposition (CVD), e.g., low pressure CVD (LPCVD), atomic layer CVD (ALCVD), ultrahigh vacuum CVD (UHVCVD), reduced pressure CVD (RPCVD), any suitable CVD; molecular beam epitaxy (MBE) process; any suitable epitaxial process; or any combinations thereof.

In some embodiments, the cleaning process 820 described above in conjunction with FIG. 8B can be applied on various semiconductor structures, e.g., FINFET transistors, micro electro-mechanical systems (MEMSs), STI structures, and/or other semiconductor structures. Due to its vapor nature, the cleaning process 820 does not substantially damage and/or crash micro structures of the FINFET transistors and MEMSs. In some embodiments cleaning STI structures, the cleaning process 820 can be used between performing an oxide CMP and a process of removing a pad nitride material. For example, after the fill-in of STI oxide, the STI oxide is subject to the oxide CMP for planarizing and exposing the pad nitride material. The cleaning process 820 is then used to remove a portion of the planarized STI oxide to a level, such that the STI oxide is substantially leveled with a liner oxide between the pad nitride material and the substrate. The pad nitride material is then removed and a substantially planarized STI structure can be achieved.

In a first exemplary embodiment, a method of forming a semiconductor device includes chemically cleaning a surface of a substrate to form a chemical oxide material on the surface. At least a portion of the chemical oxide material is removed at a removing rate of about 2 nanometer/minute (nm/min) or less. Thereafter, a gate dielectric layer is formed over the surface of the substrate.

In a second exemplary embodiment, a method of cleaning a semiconductor structure includes providing a semiconductor structure. The semiconductor structure is rotated. The semiconductor structure is cleaned with a hydrogen fluoride (HF)-containing gas.

In a third exemplary embodiment, a method of forming a semiconductor device includes forming a recess in a source/drain (S/D) region of a transistor. The recess is cleaned with a HF-containing gas. The HF-containing gas has an oxide removing rate of about 2 nanometer/minute (nm/min) or less. Thereafter, a strain structure is epitaxially formed in the recess. The strain structure provides a strain to a channel region of the transistor.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of forming a semiconductor device, the method comprising:
    chemically cleaning a surface of a substrate to form a chemical oxide material on the surface;
    removing at least a portion of the chemical oxide material at a removing rate of about 2 nanometer/minute (nm/min) or less, wherein removing at least a portion of the chemical oxide material comprises:
        rotating the substrate; and
        providing a hydrogen fluoride (HF)-containing gas to remove at least a portion of the chemical oxide material; and
    forming a gate dielectric layer over the surface of the substrate after the removing the at least a portion of the chemical oxide material.

2. The method of claim 1, wherein chemically cleaning the surface of the substrate includes at least one of a standard RCA cleaning process, a SPM cleaning process, a standard cleaning 1 (SC1) process, and a standard cleaning 2 (SC2) process.

3. The method of claim 1, wherein the removing rate is about 1 nm/min or less.

4. The method of claim 1, wherein rotating the substrate has a rotational speed of about 100 rounds per minute (RPM) or less.

5. The method of claim 1, wherein providing the HF-containing gas comprises:
    providing a first carrier gas to a first tank containing an HF-containing acid so as to carry the HF-containing gas from the first tank.

6. The method of claim 5, further comprising:
    providing a second carrier gas to a second tank containing a solvent so as to carry a solvent vapor gas from the second tank, wherein the solvent vapor is provided to dilute the HF-containing gas.

7. The method of claim 6, further comprising:
    diluting the HF-containing vapor by increasing a flowing rate of at least one of the first carrier gas and the second carrier gas.

8. A method of forming a semiconductor device, the method comprising:
    chemically cleaning a surface of a substrate to form a chemical oxide material on the surface;
    removing at least a portion of the chemical oxide material at a removing rate of about 2 nanometer/minute (nm/min) or less, wherein removing the at least a portion of the chemical oxide comprises exposing the chemical oxide to a mixture of hydrogen fluoride (HF) and isopropyl alcohol (IPA); and
    forming a gate dielectric layer over the surface of the substrate after the removing the at least a portion of the chemical oxide material.

9. The method of claim 8, wherein removing the at least one portion of the chemical oxide comprises exposing the chemical oxide to the mixture having a HF:IPA weight ratio ranging from 0.5:1 to 10:1.

10. The method of claim 8, wherein removing the at least one portion of the chemical oxide comprises exposing the chemical oxide to the mixture further comprising an inert carrier gas.

11. The method of claim 8, further comprising forming a fluorine-passivated surface on at least one of the substrate or the chemical oxide, wherein the fluorine-passivated surface has an atomic concentration of fluorine greater than 2%, and forming the gate dielectric layer over the fluorine-passivated surface.

12. The method of claim 11, further comprising baking the fluorine-passivated surface at a temperature ranging from 50° C. to 200° C.

13. The method of claim 8, further comprising forming an interfacial layer between the substrate and the gate dielectric layer.

14. The method of claim 8, further comprising forming a gate structure over the substrate, wherein the gate structure comprises:
    a fluorine-passivated surface;
    an interfacial layer over the fluorine-passivated surface;
    the gate dielectric layer over the interfacial layer; and
    a gate electrode layer over the gate dielectric layer.

15. The method of claim 1, wherein providing the HF-containing gas comprises:
    providing a first carrier gas to a first tank containing an HF-containing acid so as to carry the HF-containing gas from the first tank; and
    providing a second carrier gas to a second tank containing a solvent so as to carry a solvent vapor gas from the second tank, wherein the solvent vapor is provided to dilute the HF-containing gas.

16. The method of claim 1, further comprising:
    diluting the HF-containing gas by increasing a flowing rate of at least one of the first carrier gas and the second carrier gas.

17. The method of claim 1, wherein rotating the substrate has a rotational speed of about 10 rounds per minute (RPM) to about 100 RPM.

\* \* \* \* \*